(12) United States Patent
Kuo

(10) Patent No.: US 11,387,388 B2
(45) Date of Patent: Jul. 12, 2022

(54) LIGHT-EMITTING DIODE STRUCTURE WITH REFLECTIVE LAYER FOR IMPROVING LUMINOUS EFFICIENCY THEREOF

(71) Applicant: Lextar Electronics Corporation, Hsinchu (TW)

(72) Inventor: Shiou-Yi Kuo, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 16/744,115

(22) Filed: Jan. 15, 2020

(65) Prior Publication Data

US 2020/0227594 A1    Jul. 16, 2020

(30) Foreign Application Priority Data

Jan. 16, 2019    (CN) .......................... 201910040196.X

(51) Int. Cl.
*H01L 33/40* (2010.01)
*H01L 33/10* (2010.01)

(52) U.S. Cl.
CPC ............ *H01L 33/405* (2013.01); *H01L 33/10* (2013.01)

(58) Field of Classification Search
CPC .................................................. H01L 33/405
See application file for complete search history.

(56) References Cited

U.S. PATENT DOCUMENTS

| 6,784,463 | B2 | 8/2004 | Camras et al. |
| 7,119,372 | B2 | 10/2006 | Stokes et al. |
| 7,183,586 | B2 | 2/2007 | Ichihara et al. |
| 7,294,864 | B2 | 11/2007 | Kim et al. |
| 7,294,866 | B2 | 11/2007 | Liu |
| 7,518,153 | B2 | 4/2009 | Usuda et al. |
| 7,541,206 | B2 | 6/2009 | Yoon et al. |
| 8,179,938 | B2 | 5/2012 | Kim |
| 8,492,785 | B2 | 7/2013 | Hodota et al. |
| 8,987,761 | B2 | 3/2015 | Huang et al. |
| 9,209,356 | B2 * | 12/2015 | Chen ....................... H01L 33/42 |
| 9,768,347 | B2 | 9/2017 | Teo et al. |
| 2005/0151145 | A1 | 7/2005 | Lin |

(Continued)

FOREIGN PATENT DOCUMENTS

| CN | 102593292 A | 7/2012 |
| CN | 102947955 A | 2/2013 |

(Continued)

*Primary Examiner* — Stephen M Bradley

(74) *Attorney, Agent, or Firm* — CKC & Partners Co., LLC

(57) ABSTRACT

A light-emitting diode structure includes a first type semiconductor layer, a light-emitting layer, a second type semiconductor layer, a reflective layer, and an ohmic contact layer. The light-emitting layer is disposed under the first type semiconductor layer. The second type semiconductor layer is disposed under the light-emitting layer, wherein the second type semiconductor layer includes a plurality of recesses which are recessed from a lower surface of the second type semiconductor layer toward the light-emitting layer. The reflective layer is disposed in the recesses. The ohmic contact layer is disposed under the lower surface of the second type semiconductor layer and surrounds the recesses. The light-emitting diode structure can increase the luminous efficiency greatly.

15 Claims, 10 Drawing Sheets

(56) References Cited

U.S. PATENT DOCUMENTS

| | | | |
|---|---|---|---|
| 2006/0076565 A1* | 4/2006 | Murofushi | H01L 33/42 257/79 |
| 2006/0289886 A1 | 12/2006 | Sakai | |
| 2010/0019260 A1 | 1/2010 | Epler et al. | |
| 2010/0252850 A1* | 10/2010 | Park | H01L 21/0254 257/98 |
| 2013/0341661 A1* | 12/2013 | Higashino | H01L 33/382 257/98 |
| 2015/0179907 A1* | 6/2015 | Kojima | H01L 33/387 257/98 |
| 2018/0301596 A1 | 10/2018 | Yoo et al. | |

FOREIGN PATENT DOCUMENTS

| | | |
|---|---|---|
| CN | 104282815 A | 1/2015 |
| JP | 2006147787 A | 6/2006 |
| JP | 4622426 B2 | 2/2011 |
| TW | I244221 B | 11/2005 |
| TW | I370560 B1 | 8/2012 |
| TW | I420694 B | 12/2013 |
| TW | I529963 B | 4/2016 |
| TW | I539620 B | 6/2016 |

* cited by examiner

LIGHT-EMITTING DIODE STRUCTURE WITH REFLECTIVE LAYER FOR IMPROVING LUMINOUS EFFICIENCY THEREOF

CROSS-REFERENCE TO RELATED APPLICATION

This application claims priority to China Application Serial Number 201910040196.X, filed Jan. 16, 2019, which is herein incorporated by reference in its entirety.

BACKGROUND

Technical Field

The present disclosure relates to a light-emitting diode structure, and more particularly, to an ultraviolet light-emitting diode structure.

Description of Related Art

Ultraviolet light-emitting diode (UV LED) refers to a light-emitting diode with an emission wavelength in the ultraviolet region, and its emission wavelength can be classified into long wavelength (UVA) of 315 nm to 400 nm, medium wavelength (UVB) of 280 nm to 315 nm, and short wavelength (UVC) of below 280 nm. Since the wavelength range of the ultraviolet light-emitting diode with short wavelength is closer to X-ray and far away from ultraviolet light, it is mainly made of aluminum gallium nitride (AlGaN) currently.

However, when generally using aluminum gallium nitride as a material of the ultraviolet light-emitting diode with short wavelength, it is likely to result in a higher voltage problem due to an increase in aluminum content, and is also likely to result in the problems such as electron overflow, poor hole injection efficiency, and so on, which affect the luminous efficiency. Therefore, for the ultraviolet light-emitting diode with short wavelength, there is still much to improve in luminous efficiency or light extraction efficiency (LEE).

SUMMARY

Accordingly, one objective of the present disclosure is to provide a light-emitting diode structure for solving the aforementioned problems.

In order to achieve the aforementioned objective, one aspect of the present disclosure is to provide a light-emitting diode structure, which includes a first type semiconductor layer, a light-emitting layer, a second type semiconductor layer, a reflective layer, and an ohmic contact layer. The light-emitting layer is disposed under the first type semiconductor layer. The second type semiconductor layer is disposed under the light-emitting layer, wherein the second type semiconductor layer includes a plurality of recesses which are recessed from a lower surface of the second type semiconductor layer toward the light-emitting layer. The reflective layer is disposed in the recesses. The ohmic contact layer is disposed under the lower surface of the second type semiconductor layer and surrounds the recesses.

According to one embodiment of the present disclosure, the light-emitting diode structure further includes an electrical connection layer covering the reflective layer and the ohmic contact layer.

According to one embodiment of the present disclosure, the recesses are filled with the reflective layer, and a lower surface of the reflective layer is substantially flush with the lower surface of the second type semiconductor.

According to one embodiment of the present disclosure, the reflective layer includes a first portion and a second portion. The recesses are filled with the first portion, and the second portion is located under the first portion and extends to cover a portion of the ohmic contact layer.

According to one embodiment of the present disclosure, the light-emitting diode further includes a substrate located under the second type semiconductor layer.

Another aspect of the present disclosure is to provide a light-emitting diode structure, which includes a first type semiconductor layer, a light-emitting layer, a second type semiconductor layer, an ohmic contact layer, and a reflective layer. The light-emitting layer is disposed under the first type semiconductor layer. The second type semiconductor layer is disposed under the light-emitting layer, wherein the second type semiconductor layer includes a plurality of protruding portions which are protruded from a lower surface of the second type semiconductor layer in a direction away from the light-emitting layer. The ohmic contact layer is disposed under the protruding portions. The reflective layer is disposed under the lower surface of the second type semiconductor layer and surrounds the protruding portions.

According to one embodiment of the present disclosure, the light-emitting diode structure further includes an electrical connection layer covering the ohmic contact layer and the reflective layer.

According to one embodiment of the present disclosure, a lower surface of the reflective layer is substantially flush with a lower surface of each of the protruding portions.

According to one embodiment of the present disclosure, the reflective layer includes a first portion and a second portion. The second portion is located under the first portion and extends to cover a portion of the ohmic contact layer.

According to one embodiment of the present disclosure, the light-emitting diode further includes a substrate located under the second type semiconductor layer.

BRIEF DESCRIPTION OF THE DRAWINGS

The present disclosure can be more fully understood by reading the following detailed description of the embodiments, with reference made to the accompanying drawings as follows.

DETAILED DESCRIPTION

Figure 1:
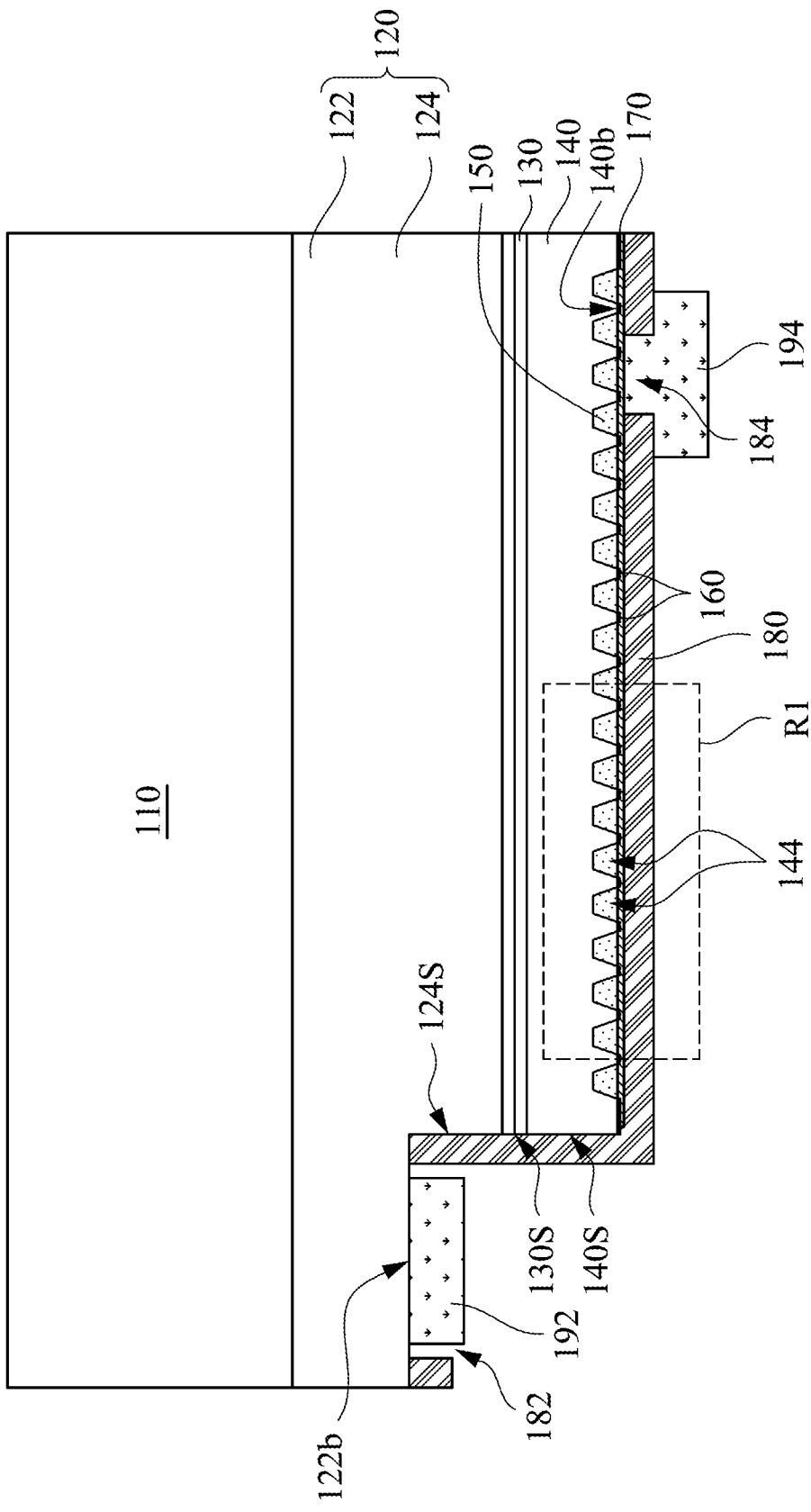
FIG. 1 is a cross-sectional view illustrating a light-emitting diode structure according to an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 2A:
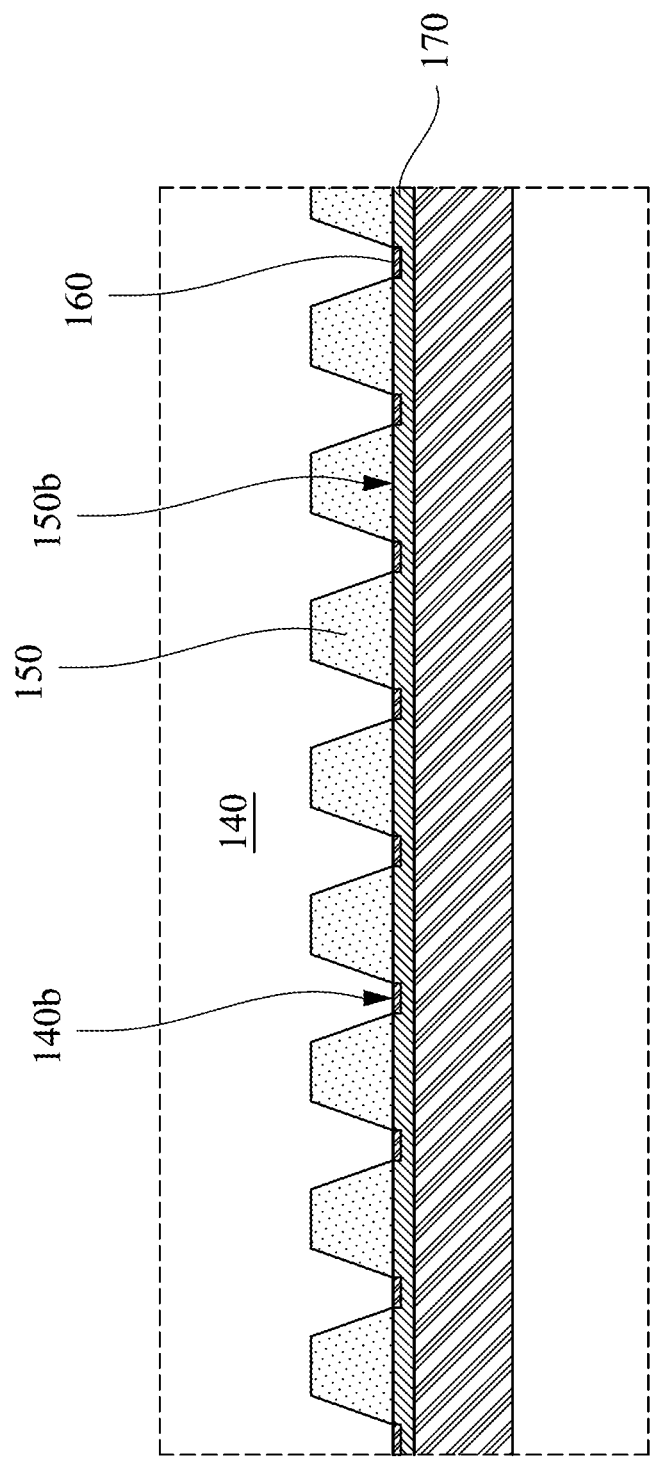
FIG. 2A is a partially enlarged schematic view of a region R1 in FIG. 1.

FIG. 1 is a cross-sectional view illustrating a light-emitting diode structure 10a according to an embodiment of the present disclosure. FIG. 2A is a partially enlarged schematic view of the region R1 in FIG. 1. Referring to FIGS. 1 and 2A simultaneously, the light-emitting diode structure 10a includes a first type semiconductor layer 120, a light-emitting layer 130, a second type semiconductor layer 140, a reflective layer 150, and an ohmic contact layer 160.

In the present embodiment, the first type semiconductor layer 120 includes a first portion 122 and a second portion 124, wherein the first portion 122 is located on the second portion 124. More specifically, a size of the first portion 122 of the first type semiconductor layer 120 is larger than a size of the second portion 124 thereof. "Size" herein refers to the area formed of the length and width of the component in the top view. In various examples, the first type semiconductor layer 120 may be N-type Group III-V semiconductor layer. For example, the Group III-V semiconductor layer may include a binary epitaxial material such as gallium nitride (GaN) or aluminum nitride (AlN), or a ternary or quaternary epitaxial material such as aluminum gallium nitride (AlGaN), indium gallium nitride (InGaN), aluminum indium gallium nitride (AlInGaN), etc. Therefore, the N-type Group III-V semiconductor layer can be formed by doping Group IVA elements (e.g., silicon or the like) into the aforementioned Group III-V semiconductor layer. In some examples, the first type semiconductor layer 120 can be formed by metal-organic chemical vapor deposition (MOCVD), liquid-phase epitaxy (LPE), or molecular beam epitaxy (MBE).

The light-emitting layer 130 is disposed under the first type semiconductor layer 120. In various examples, the size of the light-emitting layer 130 is substantially the same as the size of the second portion 124 of the first type semiconductor layer 120. In various examples, the light-emitting layer 130 may include a multiple quantum well (MQW) structure, a single-quantum well (SQW) structure, a homojunction structure, a heterojunction structure, or the like.

The second type semiconductor layer 140 is disposed under the light-emitting layer 130. More specifically, the second type semiconductor layer 140 includes a plurality of recesses 144 which are recessed from the lower surface 140b of the second type semiconductor layer 140 toward the light-emitting layer 130. It should be noted that the recesses 144 do not penetrate the second type semiconductor layer 140. In various examples, the size of the second type semiconductor layer 140 is substantially the same as the size of the light-emitting layer 130. In various examples, the second type semiconductor layer 140 may be P-type Group III-V semiconductor layer. For example, the Group III-V semiconductor layer may include a binary epitaxial material such as gallium nitride (GaN) or aluminum nitride (AlN), or a ternary or quaternary epitaxial material such as indium gallium nitride (InGaN), aluminum indium gallium nitride (AlInGaN), etc. Therefore, the P-type Group III-V semiconductor layer can be formed by doping Group IIA elements (e.g., beryllium, magnesium, calcium, strontium, etc.) into the aforementioned Group III-V semiconductor layer. In some examples, the second type semiconductor layer 140 can be formed under the light-emitting layer 130 also by metal-organic chemical vapor deposition (MOCVD), liquid-phase epitaxy (LPE), or molecular beam epitaxy (MBE).

The reflective layer 150 is disposed in the recesses 144. In the present embodiment, the reflective layer 150 includes a distributed Bragg reflector (DBR). In specific, the distributed Bragg reflector can be formed by stacking two thin films composed of homogeneous or heterogeneous materials which have different refractive indices with each other, and can reflect the light, which is emitted from the light-emitting layer 130, toward the first type semiconductor layer 120, so as to enhance the luminous efficiency of the light-emitting diode structure 10a. In various examples, the recesses 144 are filled with the reflective layer 150, and the lower surface 150b of the reflective layer 150 is substantially flush with the lower surface 140b of the second type semiconductor layer 140.

The ohmic contact layer 160 is disposed under the lower surface 140b of the second type semiconductor layer 140 and surrounds the recesses 144. In various examples, the ohmic contact layer 160 may include a transparent conductive material or a non-transparent conductive material. For example, the transparent conductive material may include indium tin oxide (ITO), indium zinc oxide (IZO), aluminum zinc oxide (AZO) or a material having light-transmitting conductive effect; and the non-transparent conductive material may include Nickel (Ni), silver (Ag), nickel gold (Ni/Au) alloy or a combination thereof.

In some examples, the light-emitting diode structure 10a further includes an electrical connection layer 170 that completely covers the reflective layer 150 and the ohmic contact layer 160. In various examples, the electrical connection layer 170 includes a highly reflective metal material such as aluminum (Al), silver (Ag), titanium (Ti), chromium (Cr), nickel (Ni), or platinum (Pt), but it is not limited thereto. The disposition of the electrical connection layer 170 can increase the electrical contact area of the ohmic contact layer 160. In addition, the electrical connection layer 170 can also be used as a reflective layer, and the light emitted from the light-emitting layer 130 is further reflected by the electrical connection layer 170 and emitted toward the first type semiconductor layer 120.

In some examples, the light-emitting diode structure 10a further includes an insulation layer 180 continuously covering the reflective layer 150, the ohmic contact layer 160, the side wall 140S of the second type semiconductor layer 140, the side wall 130S of the light-emitting layer 130, the side wall 124S of the second portion 124 of the first type semiconductor layer 120, and the lower surface 122b of the first portion 122 of the first type semiconductor layer 120. In more detail, the insulation layer 180 has a first opening 182 and a second opening 184, wherein the first opening 182 exposes a portion of the lower surface 122b of the first portion 122 of the first type semiconductor layer 120, and the second opening 184 exposes a portion of the reflective layer 150 and a portion of the ohmic contact layer 160. In the example in which the light-emitting diode structure 10a includes the electrical connection layer 170, the insulation layer 180 continuously covers the electrical connection layer 170, the side wall 140S of the second type semiconductor layer 140, the side wall 130S of the light-emitting layer 130, the side wall 124S of the second portion 124 of the first type semiconductor layer 120, and the lower surface 122b of the first portion 122 of the first type semiconductor layer 120. In more detail, the insulation layer 180 has the first opening 182 and the second opening 184, wherein the first opening 182 exposes a portion of the lower surface 122b of the first portion 122 of the first type semiconductor layer 120, and the second opening 184 exposes a portion of the electrical connection layer 170. In various embodiments, the material used for the insulation layer 180 may be silicon oxide, silicon nitride, silicon oxynitride, epoxy or other suitable insulating material. In various examples, the insulation layer 180 can be formed by chemical vapor deposition, printing, coating, or other suitable method, and the first opening 182 and the second opening 184 are formed by lithography process.

In some examples, the light-emitting diode structure 10a may further include a first electrode 192 and a second electrode 194 respectively located in the first opening 182 and the second opening 184 of the insulation layer 180. In various examples, the material of each of the first electrode 192 and the second electrode 194 may include a high work function metal such as nickel (Ni), gold (Au), silver (Ag), palladium (Pd), platinum (Pt), and/or titanium nitride (TiN). It can be understood that the first electrode 192 and the second electrode 194 of the light-emitting diode structure 10a are packaged by flip-chip process, so as to obtain the package structure of the ultraviolet light-emitting diode.

In some examples, the light-emitting diode structure 10a may further include the substrate 110 disposed on the first type semiconductor layer 120. In more detail, the substrate 110 is a transparent substrate. For example, the transparent substrate includes sapphire, glass, quartz, or other light-transmissive material. It should be noted that the substrate 110 is an omittable component in the present embodiment.

Figure 2B:
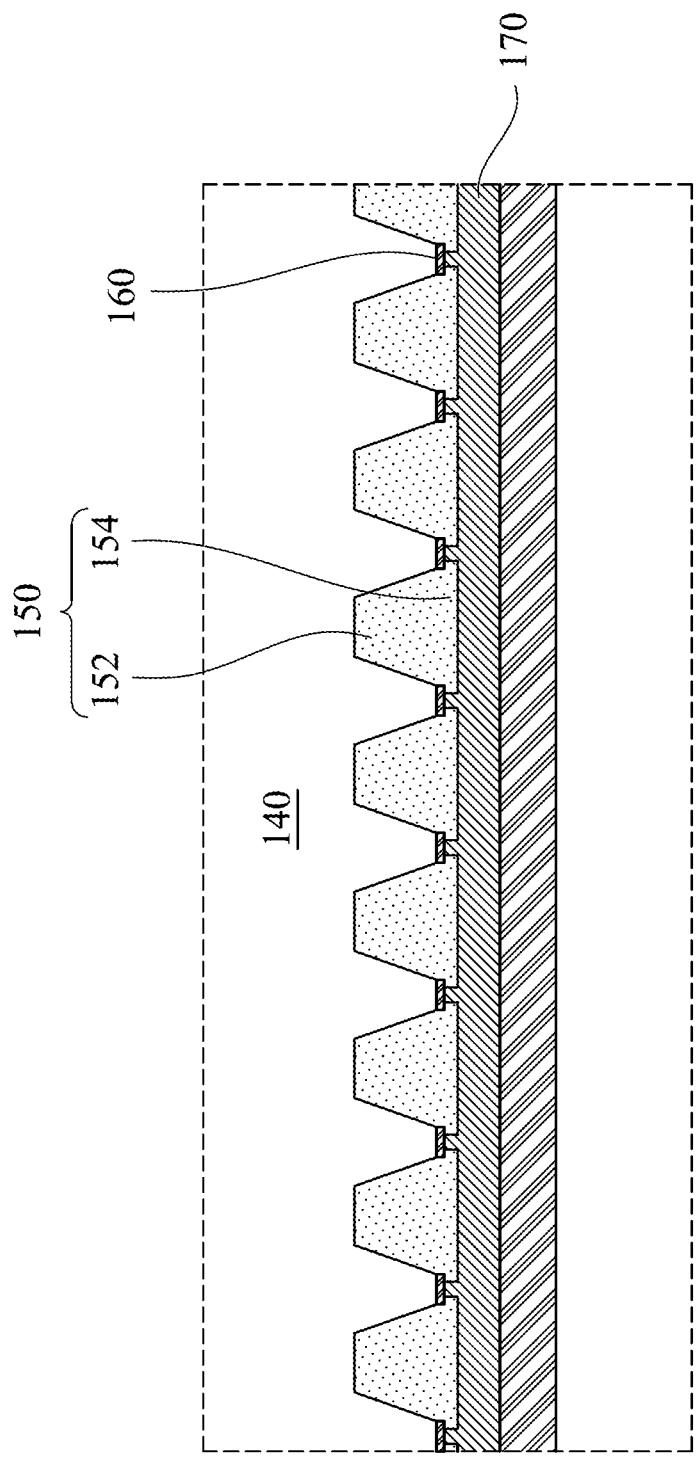
FIG. 2B is a partially enlarged schematic view of the region R1 in FIG. 1 in various embodiments of the present disclosure.

FIG. 2B is a partially enlarged schematic view of the region R1 in FIG. 1 in various embodiments of the present disclosure. In order to facilitate the comparison with the aforementioned embodiments and simplify the description, the same components are denoted by the same reference numerals in the following examples, and it mainly describes the differences between the various embodiments and no further description is provided for the repeat part.

Please refer to FIG. 2B, in some examples, the reflective layer 150 includes a first portion 152 and a second portion 154. In specific, the recesses 144 are filled with the first portion 152. The second portion 154 is located under the first portion 152 and extends to cover a portion of the ohmic contact layer 160.

Figure 3:
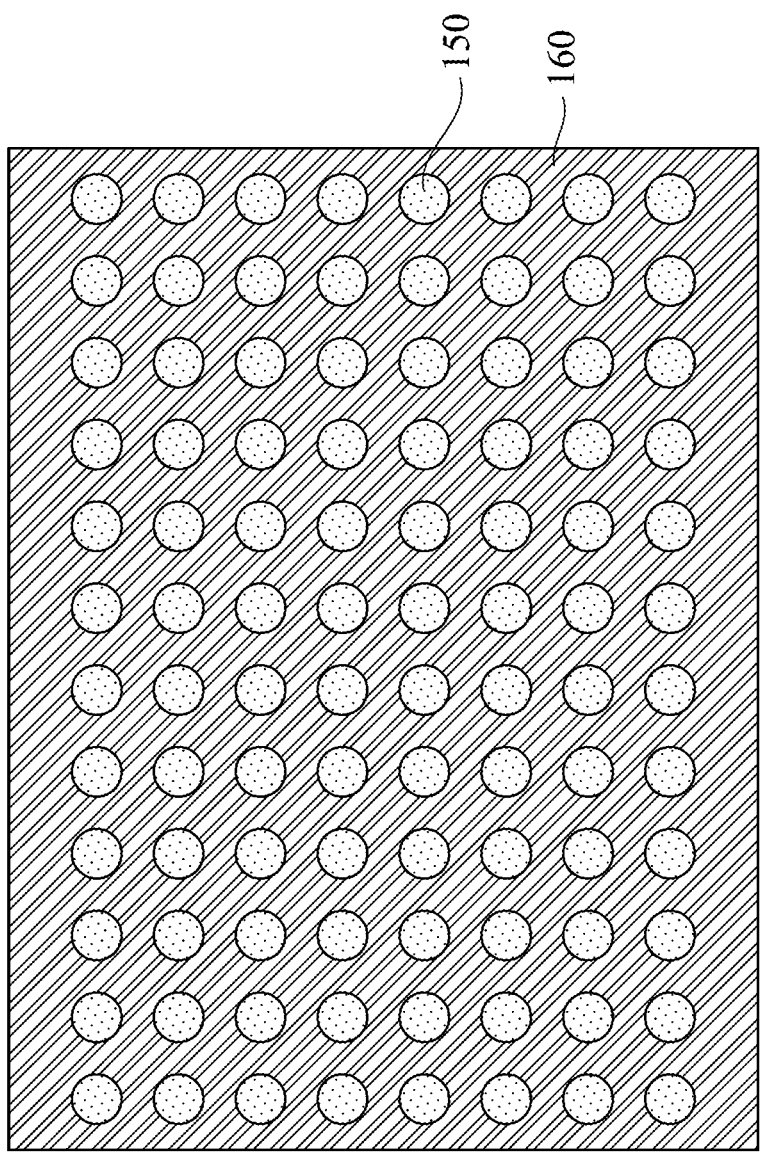
FIG. 3 is a top schematic view illustrating the second type semiconductor layer in FIG. 1.

FIG. 3 is a top schematic view illustrating the second type semiconductor layer 140 in FIG. 1. It can be understood that, no matter what the second type semiconductor layer 140 is in the example shown in FIG. 2A or in the example shown in FIG. 2B, the top view of it is shown as in FIG. 3. In other words, the reflective layer 150 is disposed in the recesses 144, and the ohmic contact layer 160 surrounds the reflective layer 150.

Figure 4:
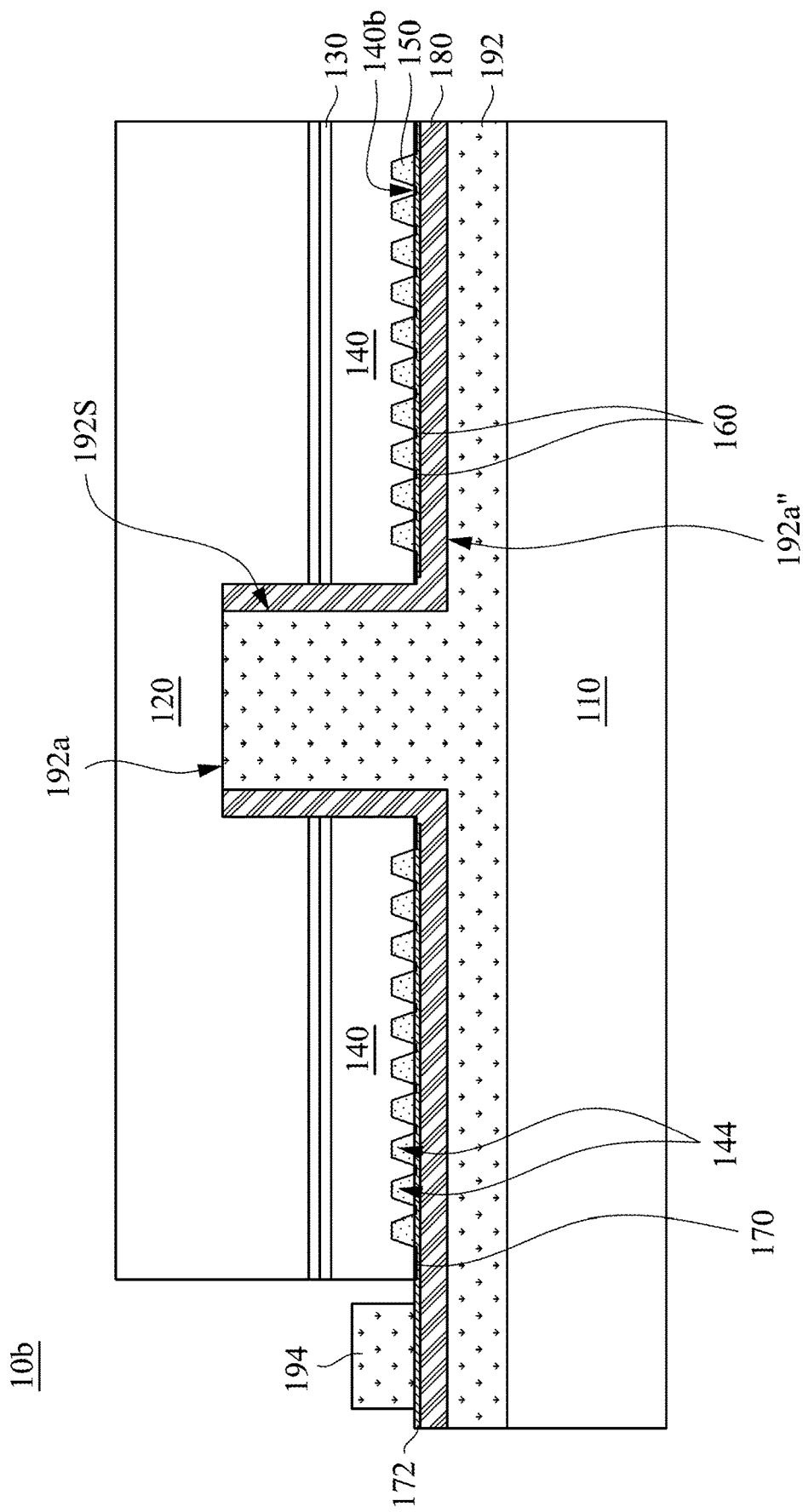
FIG. 4 is a cross-sectional view of a light-emitting diode structure according to various embodiments of the present disclosure.

FIG. 4 is a cross-sectional view of a light-emitting diode structure 10b according to various embodiments of the present disclosure. The light-emitting diode structure 10b includes the first type semiconductor layer 120, the light-emitting layer 130, the second type semiconductor layer 140, the reflective layer 150, and the ohmic contact layer 160. The materials and other features of the first type semiconductor layer 120 and the light-emitting layer 130 may be the same as or similar to those of the first type semiconductor layer 120 and the light-emitting layer 130 described with respect to FIG. 1, and no further description is provided herein.

The second type semiconductor layer 140 is disposed under the light-emitting layer 130. Specifically, the second type semiconductor layer 140 includes a plurality of recesses 144 which are recessed from the lower surface 140b of the second type semiconductor layer 140 toward the light-emitting layer 130. In the present embodiment, the first type semiconductor layer 120, the light-emitting layer 130, and the second type semiconductor layer 140 have substantially the same size. The material and other features of the second type semiconductor layer 140 may be the same as or similar to those of the second type semiconductor layer 140 described with respect to FIG. 1, and no further description is provided herein.

The reflective layer 150 is disposed in the recesses 144. The material and other features of the reflective layer 150 may be the same as or similar to those of the reflective layer 150 described with respect to FIG. 1, and no further description is provided herein.

The ohmic contact layer 160 is disposed under the lower surface 140b of the second type semiconductor layer 140 and surrounds the recesses 144. The material and other features of the ohmic contact layer 160 may be the same as or similar to those of the ohmic contact layer 160 described with respect to FIG. 1, and no further description is provided herein.

In some examples, the light-emitting diode structure 10b further includes the electrical connection layer 170 that completely covers the reflective layer 150 and the ohmic contact layer 160. The material and other features of the electrical connection layer 170 may be the same as or similar to those of the electrical connection layer 170 described with respect to FIG. 1, and no further description is provided herein. It should be noted that in the present embodiment, in addition to fully covering the reflective layer 150 and the ohmic contact layer 160, the electrical connection layer 170 further extends outwardly to form a platform 172 to facilitate disposing subsequent electrodes.

In some examples, the light-emitting diode structure 10b further includes the first electrode 192 and the second electrode 194. Specifically, the first electrode 192 is disposed under the electrical connection layer 170, and a portion of the first electrode 192 extends upward and penetrates through the reflective layer 150, the ohmic contact layer 160, the second type semiconductor layer 140, the light-emitting layer 130, and a portion of the first type semiconductor layer 120. As shown in FIG. 4, the cross section of the first electrode 192 has a protrusion-shaped profile. It should be noted that the portion of the first electrode 192 which is extended upward does not penetrate the first type semiconductor layer 120. The second electrode 194 is disposed on the platform 172 of the electrical connection layer 170. In various examples, the second electrode 194 is substantially aligned with the first electrode 192. "Substantially aligned" herein means that the vertical projection of the second electrode 194 overlaps the vertical projection of the first electrode 192. Preferably, the projection of the second electrode 194 falls within the vertical projection of the first electrode 192. The materials of the first electrode 192 and the second electrode 194 may be the same as or similar to that of the first electrode 192 and the second electrode 194 described with respect to FIG. 1. It can be understood that the present embodiment is packaged by wire bonding, so as to obtain the package structure of the ultraviolet light-emitting diode.

In some examples, the light-emitting diode structure 10*b* further includes the insulation layer 180 interposed between the electrical connection layer 170 and the first electrode 192. In more detail, the insulation layer 180 completely covers the second surface 192*a*″ of the first electrode 192 and extends to cover the side wall 192S of the portion of the first electrode 192 which is extended upward. It should be noted that the first surface 192*a* of the portion of the first electrode 192 which is extended upward is not covered by the insulation layer 180, thereby being electrically connected to the first type semiconductor layer 120.

In some examples, the light-emitting diode structure 10*b* further includes the substrate 110 located under the second type semiconductor layer 140. In more detail, the substrate 110 is located under the first electrode 192. In various examples, the substrate 110 may be a transparent substrate or a non-transparent substrate. For example, the transparent substrate includes sapphire, glass, quartz, or other light-transmissive materials, and the non-transparent substrate includes ceramic, silicon substrate, metal substrate, or other non-transparent materials. It should be noted that in the present embodiment, the substrate 110 is an essential component for providing the support force in the process.

Figure 5:
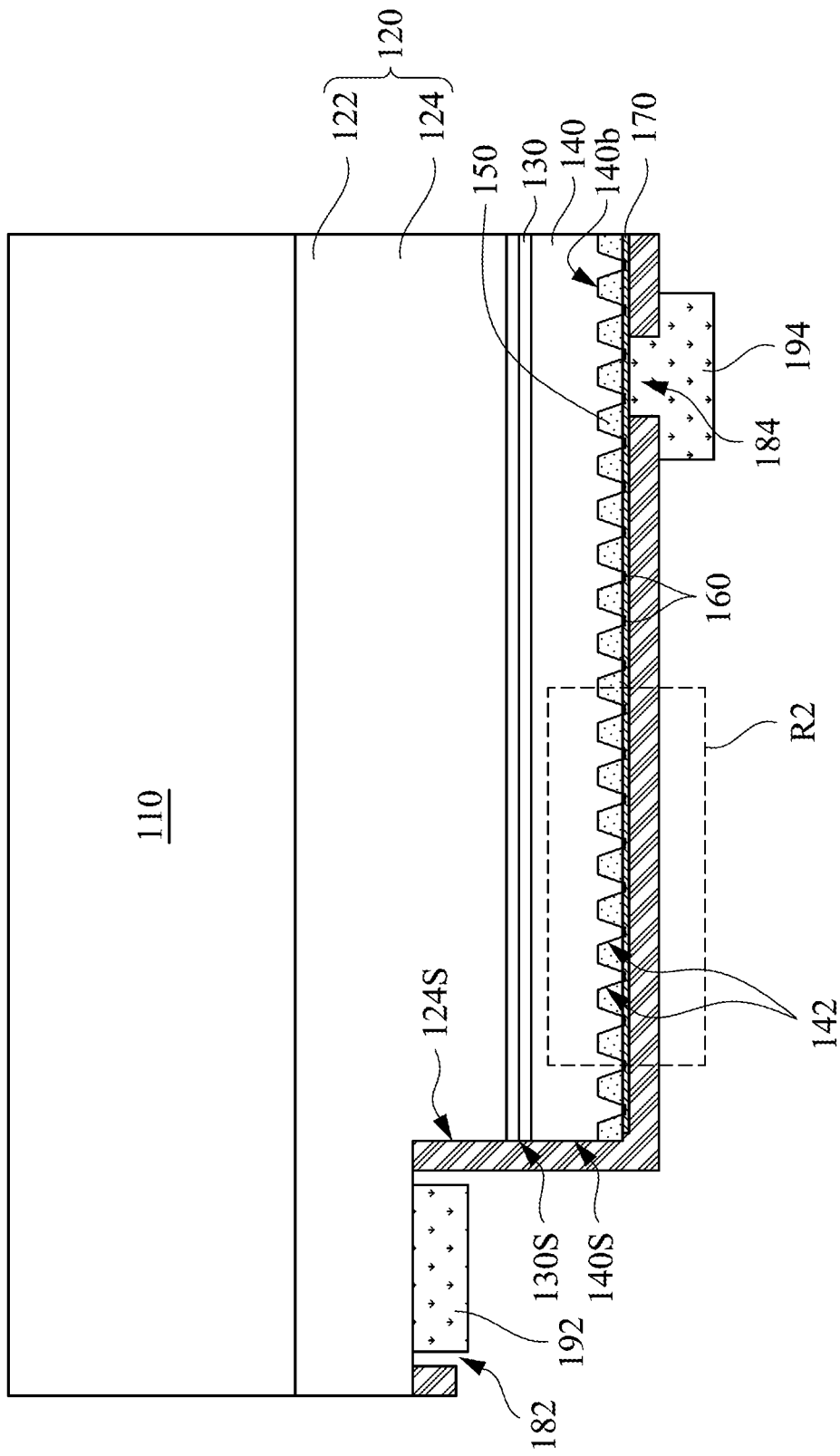
FIG. 5 is a cross-sectional view illustrating a light-emitting diode structure according to another embodiment of the present disclosure.
Figure 6A:
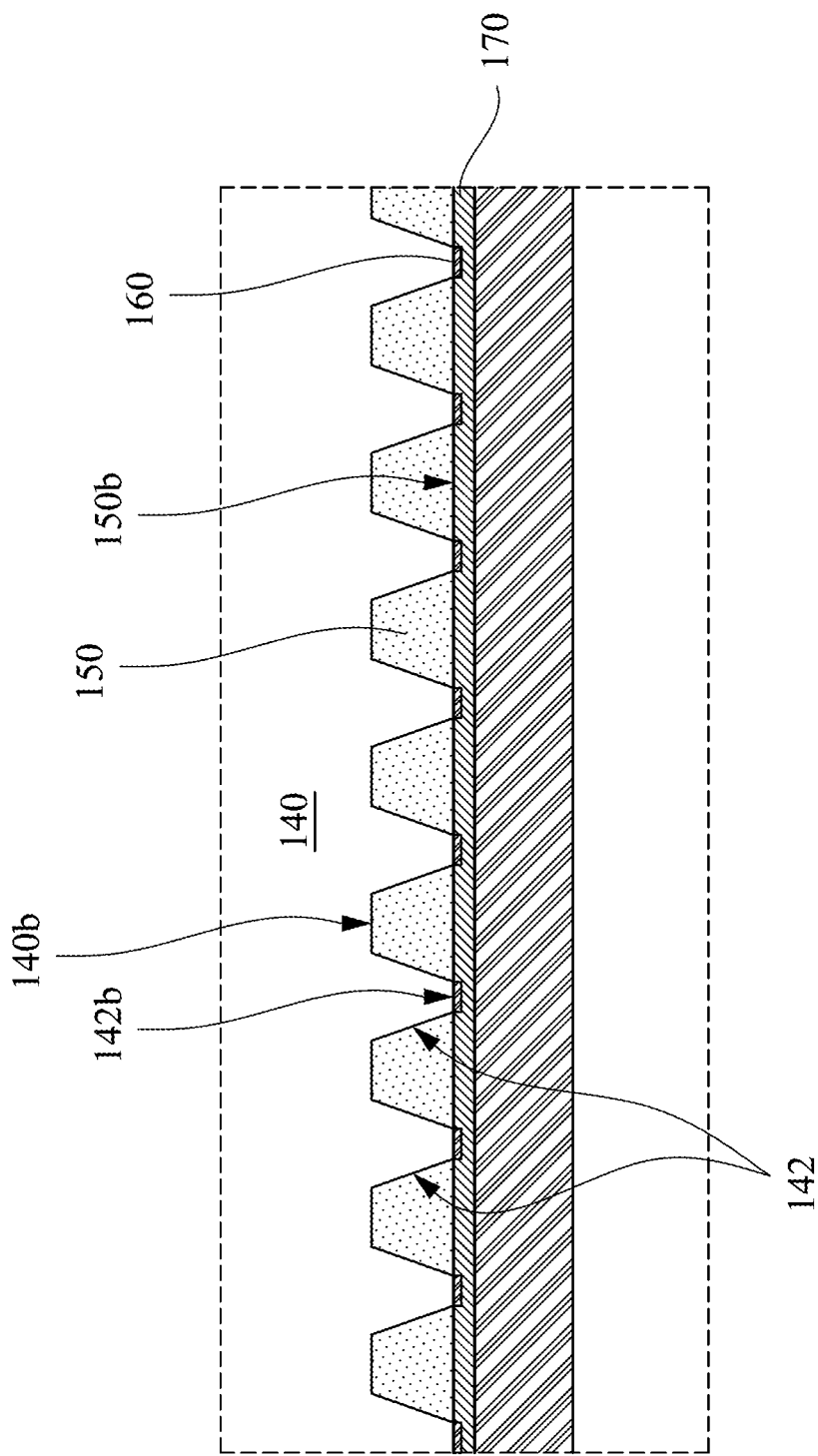
FIG. 6A is a partially enlarged schematic view of a region R2 in FIG. 5.

FIG. 5 is a cross-sectional view illustrating a light-emitting diode structure 10*c* according to another embodiment of the present disclosure. FIG. 6A is a partially enlarged schematic view of the region R2 in FIG. 5. Please refer to FIG. 5 and FIG. 6A simultaneously, the light-emitting diode structure 10*c* includes the first type semiconductor layer 120, the light-emitting layer 130, the second type semiconductor layer 140, the ohmic contact layer 160, and the reflective layer 150. The material and other features of the first type semiconductor layer 120 may be the same as or similar to those of the first type semiconductor layer 120 described with respect to FIG. 1, and no further description is provided herein.

The light-emitting layer 130 is disposed under the first type semiconductor layer 120. The material and other features of the light-emitting layer 130 may be the same as or similar to those of the light-emitting layer 130 described with respect to FIG. 1, and no further description is provided herein.

The second type semiconductor layer 140 is disposed under the light-emitting layer 130. More specifically, the second type semiconductor layer 140 includes a plurality of protruding portions 142 which are protruded from the lower surface 140*b* of the second type semiconductor layer 140 in a direction away from the light-emitting layer 130. The material of the second type semiconductor layer 140 may be the same as or similar to that of the second type semiconductor layer 140 described with respect to FIG. 1, and no further description is provided herein.

The ohmic contact layer 160 is disposed under the protruding portions 142. The material of the ohmic contact layer 160 may be the same as or similar to that of the ohmic contact layer 160 described with respect to FIG. 1, and no further description is provided herein.

The reflective layer 150 is disposed under the lower surface 140*b* of the second type semiconductor layer 140 and surrounds the protruding portions 142. In various examples, the lower surface 150*b* of the reflective layer 150 is substantially flush with the lower surfaces 142*b* of the protruding portions 142. In other words, the ohmic contact layer 160 is lower than the lower surface 150*b* of the reflective layer 150. The material of the reflective layer 150 may be the same as or similar to that of the reflective layer 150 described with respect to FIG. 1, and no further description is provided herein.

In some examples, the light-emitting diode structure 10*c* further includes the electrical connection layer 170 completely covering the reflective layer 150 and the ohmic contact layer 160. The material and other features of the electrical connection layer 170 may be the same as or similar to those of the electrical connection layer 170 described with respect to FIG. 1, and no further description is provided herein.

In some examples, the light-emitting diode structure 10*c* further includes the first electrode 192, the second electrode 194, the insulation layer 180, and/or the substrate 110. The materials and other features of the first electrode 192, the second electrode 194, the insulation layer 180, and the substrate 110 may be the same as or similar to those of the first electrode 192, the second electrode 194, the insulation layer 180, and the substrate 110 described with respect to FIG. 1, and no further description is provided herein. It should be noted that in the present embodiment, the substrate 110 is an omittable component.

Figure 6B:
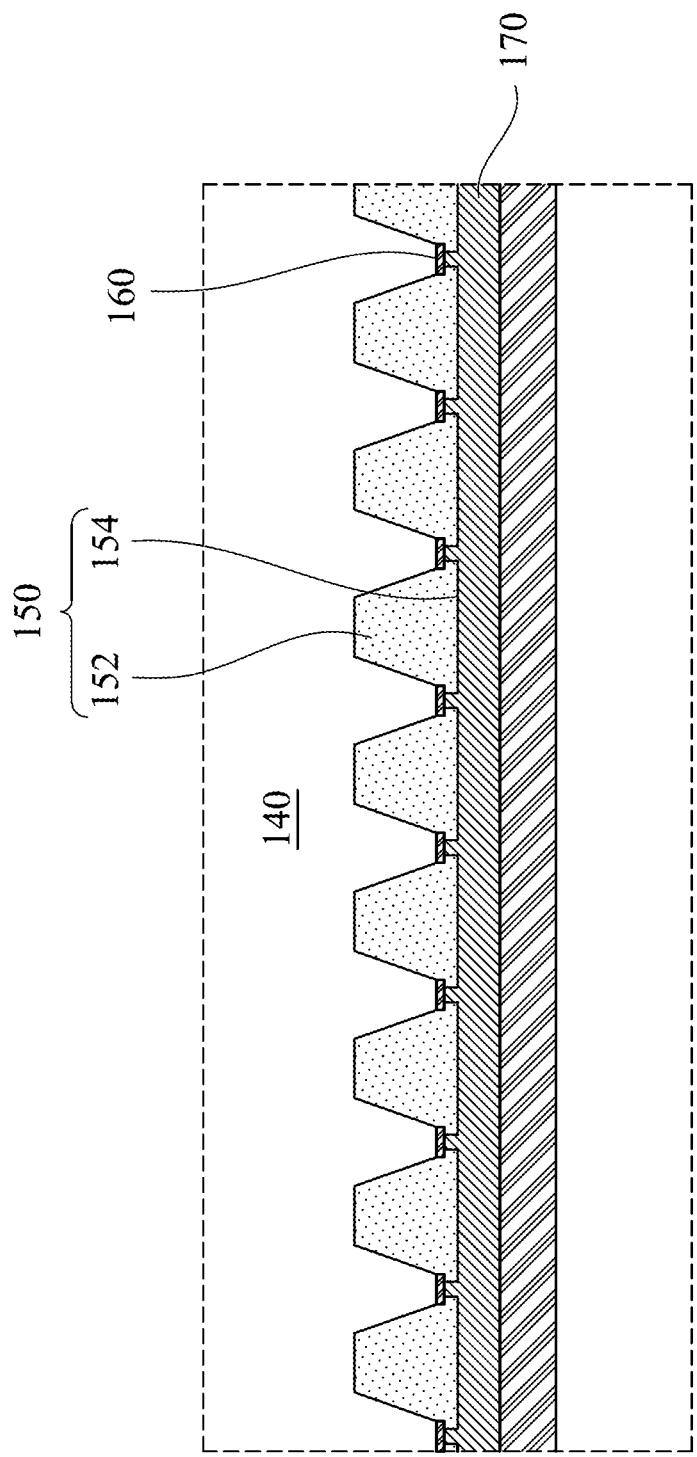
FIG. 6B is a partially enlarged schematic view of the region R2 in FIG. 5 in various embodiments of the present disclosure.

FIG. 6B is a partially enlarged schematic view of the region R2 in FIG. 5 in various embodiments of the present disclosure. In order to facilitate the comparison with the aforementioned embodiments and simplify the description, the same components are denoted by the same reference numerals in the following examples, and it mainly describes the differences between the various embodiments and no further description is provided for the repeat part.

Please refer to FIG. 6B, in some examples, the reflective layer 150 includes the first portion 152 and the second portion 154. In specific, the spaces between the adjacent protruding portions 142 are filled with the first portion 152, and the second portion 154 is located under the first portion 152 and extends to cover a portion of the ohmic contact layer 160.

Figure 7:
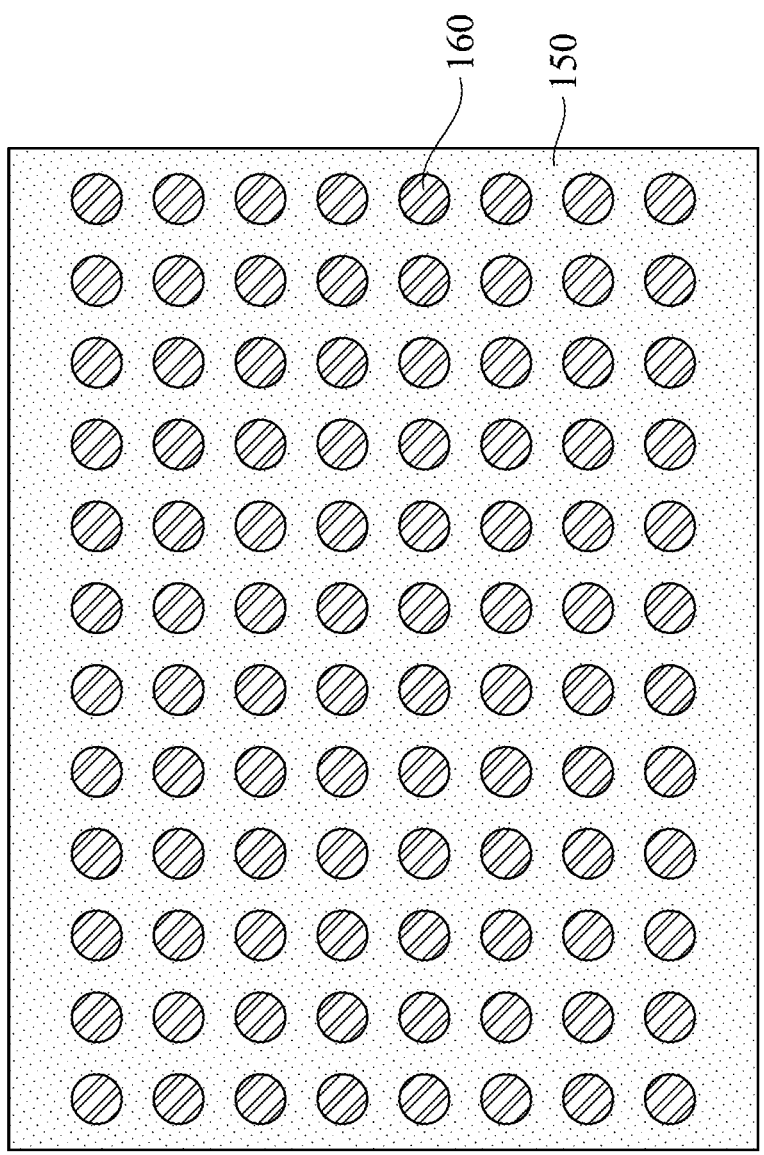
FIG. 7 is a top schematic view illustrating the second type semiconductor layer in FIG. 5.

FIG. 7 is a top schematic view illustrating the second type semiconductor layer 140 in FIG. 5. It can be understood that, no matter what the second type semiconductor layer 140 is in the example shown in FIG. 6A or in the example shown in FIG. 6B, the top view of it is shown as in FIG. 7. In other words, the ohmic contact layer 160 is disposed under the protruding portions 142, and the reflective layer 150 surrounds the ohmic contact layer 160.

Figure 8:
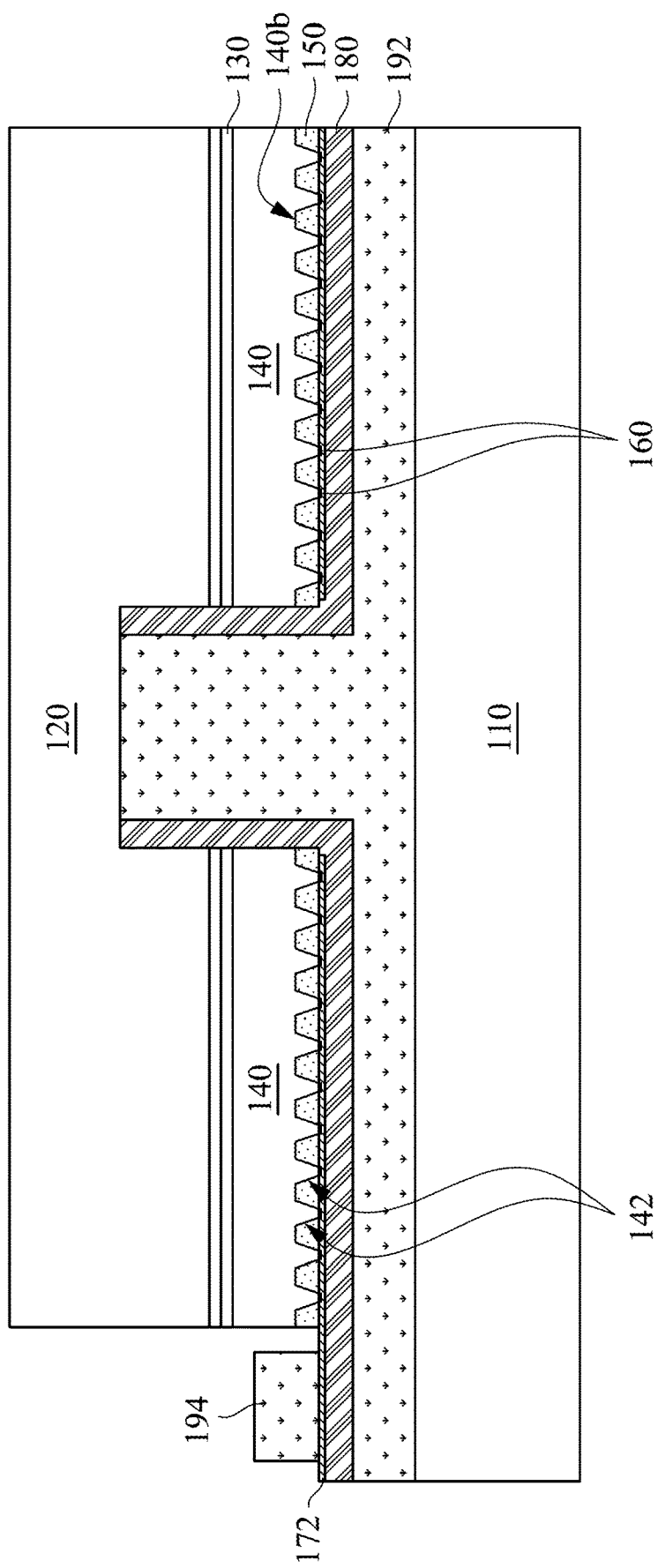
FIG. 8 is a cross-sectional view illustrating a light-emitting diode structure according to various embodiments of the present disclosure.

FIG. 8 is a cross-sectional view illustrating a light-emitting diode structure 10*d* according to various embodiments of the present disclosure. The light-emitting diode structure 10*d* includes the first type semiconductor layer 120, the light-emitting layer 130, the second type semiconductor layer 140, the ohmic contact layer 160, and the reflective layer 150. The materials and other features of the first type semiconductor layer 120 and the light-emitting layer 130 may be the same as or similar to those of the first type semiconductor layer 120 and the light-emitting layer 130 described with respect to FIG. 4, and no further description is provided herein.

The second type semiconductor layer 140 is disposed under the light-emitting layer 130. Specifically, the second type semiconductor layer 140 includes a plurality of protruding portions 142 which are protruded from the lower surface 140b of the second type semiconductor layer 140 in a direction away from the light-emitting layer 130. In the present embodiment, the first type semiconductor layer 120, the light-emitting layer 130, and the second type semiconductor layer 140 have substantially the same size. The material and other features of the second type semiconductor layer 140 may be the same as or similar to those of the second type semiconductor layer 140 described with respect to FIG. 4, and no further description is provided herein.

The ohmic contact layer 160 is disposed under the protruding portions 142. The material and other features of the ohmic contact layer 160 may be the same as or similar to those of the ohmic contact layer 160 described with respect to FIG. 4, and no further description is provided herein.

The reflective layer 150 is disposed under the lower surface 140b of the second type semiconductor layer 140 and surrounds the protruding portions 142. The material and other features of the reflective layer 150 may be the same as or similar to those of the reflective layer 150 described with respect to FIG. 4, and no further description is provided herein.

In some examples, the light-emitting diode structure 10d further includes the electrical connection layer 170 that completely covers the reflective layer 150 and the ohmic contact layer 160. The material and other features of the electrical connection layer 170 may be the same as or similar to the electrical connection layer 170 described with respect to FIG. 4, and no further description is provided herein. It should be noted that in the present embodiment, in addition to fully covering the reflective layer 150 and the ohmic contact layer 160, the electrical connection layer 170 extends outwardly to form the platform 172 to facilitate disposing subsequent electrodes.

In some examples, the light-emitting diode structure 10d further includes the first electrode 192, the second electrode 194, the insulation layer 180, and/or the substrate 110. The materials and other features of the first electrode 192, the second electrode 194, the insulation layer 180, and the substrate 110 may be the same as or similar to those of the first electrode 192, the second electrode 194, the insulation layer 180, and the substrate 110 described with respect to FIG. 4, and no further description is provided herein. It should be noted that in the present embodiment, the substrate 110 is an essential component for providing the support force in the process.

In summary, the light-emitting diode structure provided by the present disclosure can greatly improve the luminous efficiency or light extraction efficiency of the ultraviolet light-emitting diode with short wavelength.

While various embodiments of the present disclosure have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A light-emitting diode structure, comprising:
a first type semiconductor layer;
a light-emitting layer disposed under the first type semiconductor layer;
a second type semiconductor layer disposed under the light-emitting layer, wherein the second type semiconductor layer comprises a plurality of recesses which are recessed from a lower surface of the second type semiconductor layer toward the light-emitting layer;
a reflective layer disposed in the recesses;
an ohmic contact layer disposed under the lower surface of the second type semiconductor layer and surrounding the recesses;
an electrical connection layer covering the reflective layer and the ohmic contact layer; and
an electrode in contact with the electrical connection layer.

2. The light-emitting diode structure of claim 1, wherein the recesses are filled with the reflective layer, and a lower surface of the reflective layer is substantially flush with the lower surface of the second type semiconductor layer.

3. The light-emitting diode structure of claim 1, wherein the reflective layer comprises a first portion and a second portion, the recesses are filled with the first portion, and the second portion is located under the first portion and extends to cover a portion of the ohmic contact layer.

4. The light-emitting diode structure of claim 1, further comprising a substrate located under the second type semiconductor layer.

5. A light-emitting diode structure, comprising:
a first type semiconductor layer;
a light-emitting layer disposed under the first type semiconductor layer;
a second type semiconductor layer disposed under the light-emitting layer, wherein the second type semiconductor layer comprises a plurality of protruding portions which are protruded from a lower surface of the second type semiconductor layer in a direction away from the light-emitting layer;
an ohmic contact layer disposed under the protruding portions;
a reflective layer disposed under the lower surface of the second type semiconductor layer and surrounding the protruding portions, the reflective layer at least covering an entirety of the lower surface of the second type semiconductor layer except for portions of the lower surface of the second type semiconductor layer having the protruding portions thereon and including two stacked thin films having different refractive indices than each other;
an electrical connection layer covering the reflective layer and the ohmic contact layer; and
an electrode in contact with the electrical connection layer.

6. The light-emitting diode structure of claim 5, wherein a lower surface of the reflective layer is substantially flush with a lower surface of each of the protruding portions.

7. The light-emitting diode structure of claim 5, wherein the reflective layer comprises a first portion and a second portion, the second portion is located under the first portion and extends to cover a portion of the ohmic contact layer.

8. The light-emitting diode structure of claim 5, further comprising a substrate under the second type semiconductor layer.

9. The light-emitting diode structure of claim 1, wherein a maximum vertical dimension of the reflective layer is less than a minimum vertical dimension of the second type semiconductor layer.

10. The light-emitting diode structure of claim 5, wherein a maximum vertical dimension of the reflective layer is less than a minimum vertical dimension of the second type semiconductor layer.

11. A light-emitting diode structure, comprising:
a first type semiconductor layer;
a light-emitting layer disposed under the first type semiconductor layer;
a second type semiconductor layer disposed under the light-emitting layer, wherein the second type semiconductor layer comprises a plurality of protruding portions which are protruded from a lower surface of the second type semiconductor layer in a direction away from the light-emitting layer;
an ohmic contact layer disposed under the protruding portions;
a reflective layer disposed under the lower surface of the second type semiconductor layer and laterally surrounding an entirety of the protruding portions, the reflective layer including two stacked thin films having different refractive indices than each other;
an electrical connection layer covering the reflective layer and the ohmic contact layer; and
an electrode in contact with the electrical connection layer.

12. The light-emitting diode structure of claim 11, wherein a lower surface of the reflective layer is substantially flush with a lower surface of each of the protruding portions.

13. The light-emitting diode structure of claim 11, wherein the reflective layer comprises a first portion and a second portion, the second portion is located under the first portion and extends to cover a portion of the ohmic contact layer.

14. The light-emitting diode structure of claim 11, further comprising a substrate under the second type semiconductor layer.

15. The light-emitting diode structure of claim 11, wherein a maximum vertical dimension of the reflective layer is less than a minimum vertical dimension of the second type semiconductor layer.

* * * * *